United States Patent
Ozaki et al.

(10) Patent No.: US 9,306,052 B2
(45) Date of Patent: Apr. 5, 2016

(54) COMPOUND SEMICONDUCTOR DEVICE AND METHOD OF MANUFACTURING THE SAME

(71) Applicant: FUJITSU LIMITED, Kawasaki-shi, Kanagawa (JP)

(72) Inventors: Shirou Ozaki, Yamato (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/671,375

(22) Filed: Mar. 27, 2015

(65) Prior Publication Data
US 2015/0295074 A1   Oct. 15, 2015

(30) Foreign Application Priority Data
Apr. 14, 2014  (JP) ................. 2014-082813

(51) Int. Cl.
| | |
|---|---|
| *H01L 29/778* | (2006.01) |
| *H01L 21/02* | (2006.01) |
| *H01L 29/66* | (2006.01) |
| *H01L 21/268* | (2006.01) |
| *H01L 23/31* | (2006.01) |
| *H01L 23/532* | (2006.01) |
| *H01L 23/482* | (2006.01) |
| *H01L 29/20* | (2006.01) |

(52) U.S. Cl.
CPC ...... *H01L 29/7787* (2013.01); *H01L 21/02118* (2013.01); *H01L 21/02186* (2013.01); *H01L 21/2686* (2013.01); *H01L 23/315* (2013.01); *H01L 23/4821* (2013.01); *H01L 23/53295* (2013.01); *H01L 29/66462* (2013.01); *H01L 29/2003* (2013.01); *H01L 2224/05553* (2013.01); *H01L 2224/0603* (2013.01); *H01L 2224/48091* (2013.01); *H01L 2224/48247* (2013.01); *H01L 2224/48257* (2013.01); *H01L 2224/48472* (2013.01)

(58) Field of Classification Search
CPC .................. H01L 21/02118; H01L 21/02186; H01L 21/02183; H01L 23/315; H01L 29/778; H01L 29/7787; H01L 29/66462; H01L 29/7786; H01L 29/66431
See application file for complete search history.

(56) References Cited

U.S. PATENT DOCUMENTS

| | | |
|---|---|---|
| 6,998,695 B2 | 2/2006 | Makiyama et al. |
| 7,256,127 B2 | 8/2007 | Gallagher |
| 7,666,754 B2 | 2/2010 | Toma et al. |
| 7,678,682 B2 | 3/2010 | Waldfried et al. |

(Continued)

FOREIGN PATENT DOCUMENTS

| | | |
|---|---|---|
| JP | 5-335343 | 12/1993 |
| JP | 2004-095637 | 3/2004 |
| JP | 2004-266244 | 9/2004 |
| JP | 2006-190872 | 7/2006 |
| JP | 2006-210499 | 8/2006 |
| JP | 2008-520100 | 6/2008 |
| JP | 2009-272433 | 11/2009 |
| JP | 2011-503840 | 1/2011 |

*Primary Examiner* — Jose R Diaz
(74) *Attorney, Agent, or Firm* — Fujitsu Patent Center (57) ABSTRACT

A compound semiconductor device includes: an electron transit layer; an electron supply layer over the electron transit layer; a gate electrode, a source electrode and a drain electrode at a level above the electron supply layer; and a porous electrical insulating film that covers the gate electrode, the source electrode and the drain electrode, the porous electrical insulating film containing an organic constituent, and a cavity being formed around the gate electrode in the porous electrical insulating film. A cross-linking layer is on a surface of the porous electrical insulating film at the cavity side.

14 Claims, 12 Drawing Sheets

(56) References Cited

U.S. PATENT DOCUMENTS

| | | |
|---|---|---|
| 7,704,872 B2 | 4/2010 | Waldfried et al. |
| 7,723,850 B2 | 5/2010 | Gallagher |
| 8,766,350 B2* | 7/2014 | Arisumi ............ H01L 21/28273 257/315 |
| 2006/0069171 A1* | 3/2006 | Prokopowicz ...... H01L 21/7682 521/61 |
| 2012/0037962 A1* | 2/2012 | Breyta .............. H01L 21/31144 257/288 |
| 2014/0306231 A1* | 10/2014 | Ozaki ................... H01L 23/315 257/76 |
| 2015/0060946 A1* | 3/2015 | Makiyama ............ H01L 29/402 257/194 |
| 2015/0115411 A1* | 4/2015 | Ozaki ................. H01L 21/3105 257/620 |

* cited by examiner

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2014-082813, filed on Apr. 14, 2014, the entire contents of which are incorporated herein by reference.

FIELD

The embodiments discussed herein are directed to a compound semiconductor device and a method of manufacturing the same, and the like.

BACKGROUND

A high electron mobility transistor (HEMT) has an excellent high-speed performance, and therefore, HEMT is applied for a signal processing circuit for an optical communication system, other high-speed digital circuits, for example. In particular, HEMT has an excellent low-noise performance, and therefore, an application for an amplifier at microwave band or millimeter wave band has been expected. To obtain a sufficient amplifier gain when the amplifier is operated at the millimeter wave band, it is effective to increase a current gain cut-off frequency ($f_T$). It is possible to increase the current gain cut-off frequency ($f_T$) by reducing a capacitance between a gate and a source.

A low dielectric constant film is used for an interlayer insulating film to reduce a parasitic capacitance between wirings. For example, low dielectric constant materials such as benzocyclobutone (BCB) and polysilazane are used for an interlayer insulating film of a monolithic microwave integrated circuit (MMIC).

It is also discussed to form a cavity around a gate electrode in an interlayer insulating film to improve high-frequency characteristics of a HEMI.

However, when a cavity is formed, strength of an interlayer insulating film is lowered, and it is easy to be affected by transmission of moisture from outside.

Patent Literature 1: Japanese Laid-open Patent Publication No. 2004-95637
Patent Literature 2: Japanese Laid-open Patent Publication No. 2006-210499
Patent Literature 3: Japanese Laid-open Patent Publication No. 05-335343
Patent Literature 4: Japanese Laid-open Patent Publication No. 2009-272433

SUMMARY

According to an aspect of the embodiments, a compound semiconductor device includes: an electron transit layer; an electron supply layer over the electron transit layer; a gate electrode, a source electrode and a drain electrode at a level above the electron supply layer; and a porous electrical insulating film that covers the gate electrode, the source electrode and the drain electrode, the porous electrical insulating film containing an organic constituent, and a cavity being formed around the gate electrode in the porous electrical insulating film. A cross-linking layer is on a surface of the porous electrical insulating film at the cavity side.

According to another aspect of the embodiments, a method of manufacturing a compound semiconductor device includes: forming an electron supply layer over an electron transit layer; forming a gate electrode, a source electrode and a drain electrode at a level above the electron supply layer; forming an organic film around the gate electrode, the organic film containing a functional group containing oxygen; forming a porous electrical insulating film that covers the gate electrode, the source electrode and the drain electrode over the organic film, the porous electrical insulating film containing an organic constituent; and irradiating the organic film with ultraviolet light through the porous electrical insulating film so as to decompose the organic film, form a cavity in the porous electrical insulating film while forming a cross-linking layer on a surface of the porous electrical insulating film at the cavity side.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3A to FIG. 3L are sectional views illustrating a method of manufacturing the compound semiconductor device according to the second embodiment in process sequence;

DESCRIPTION OF EMBODIMENTS

A cavity may be formed, for example, as described below. First, an organic film is formed at a part where the cavity is to be formed, namely, around a gate electrode. As the organic film, one which can be decomposed by later-described ultraviolet light irradiation is formed. Then, a porous electrical insulating film is formed as an interlayer insulating film so as to cover a whole surface. Thereafter, the organic film is decomposed by ultraviolet light having a wavelength which transmits the porous electrical insulating film. Components of the organic film vaporized by the decomposition are discharged outside the porous electrical insulating film via openings of the porous electrical insulating film.

However, according to this method, a stress is applied to the porous electrical insulating film by the vaporization of the components of the organic film. A lot of openings exist at a porous electrical insulating film, and therefore, a density of the porous electrical insulating film is low. Accordingly, when a stress is applied to a porous electrical insulating film, a crack is easily made at the porous electrical insulating film. If a crack is made at a porous electrical insulating film, moisture in the atmosphere may transmit inside the cavity via the crack. The transmission of moisture as stated above causes oxidization of wiring metal, short-circuiting between wirings, increase of a contact resistance, or the like. Namely, the crack is a cause of lowering of electric characteristics.

Hereinafter, preferred embodiments will be explained with reference to accompanying drawings.

First Embodiment

Figure 1:
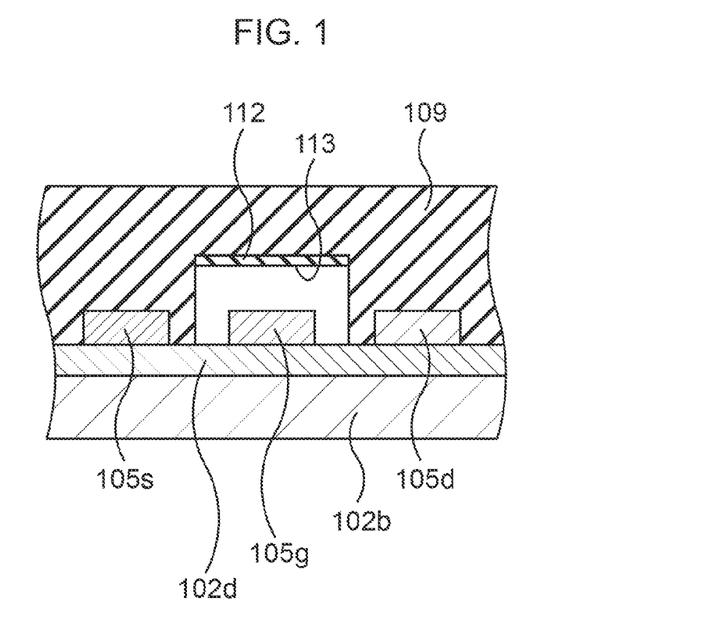
FIG. 1 is a sectional view illustrating a structure of a compound semiconductor device according to a first embodiment.

First, a first embodiment is described. The first embodiment is an example of a GaN based HEMT. FIG. 1 is a sectional view illustrating a structure of a compound semiconductor device according to the first embodiment.

An electron transit layer 102b, an electron supply layer 102d over the electron transit layer 102b, and a gate electrode 105g, a source electrode 105s and a drain electrode 105d at a level above the electron supply layer 102d are included in the first embodiment, as illustrated in FIG. 1. A porous electrical insulating film 109 that covers the gate electrode 105g, the source electrode 105s and the drain electrode 105d is in included in the first embodiment. The porous electrical insulating film 109 contains an organic constituent, and a cavity 113 is formed around the gate electrode 105g in the porous electrical insulating film 109. A cross-linking layer 112 is on a surface of the porous electrical insulating film 109 at the cavity 113 side. The cross-linking layer 112 is formed by cross-linking reaction of the organic constituent contained in the porous electrical insulating film 109, for example.

According to the first embodiment as stated above, a dielectric constant of the porous electrical insulating film 109 is low, and therefore, it is possible to obtain a high current gain cut-off frequency ($f_T$). The cavity 113 is formed around the gate electrode 105g, and therefore, it is possible to obtain fine high-frequency characteristics. A mechanical strength of a general porous material is low compared to that of other low-dielectric constant materials, and a crack may be made easily. On the other hand, in the first embodiment, the mechanical strength of the porous electrical insulating film 109 is increased by the cross-linking layer 112. Accordingly, even if a crack is made at a part other than the cross-linking layer 112 of the porous electrical insulating film 109, it is difficult for the crack to penetrate the cross-linking layer 112. Therefore, it is possible to suppress the transmission of moisture via a crack and to suppress lowering of the electric characteristics due to the transmission of moisture.

Second Embodiment

Figure 2:
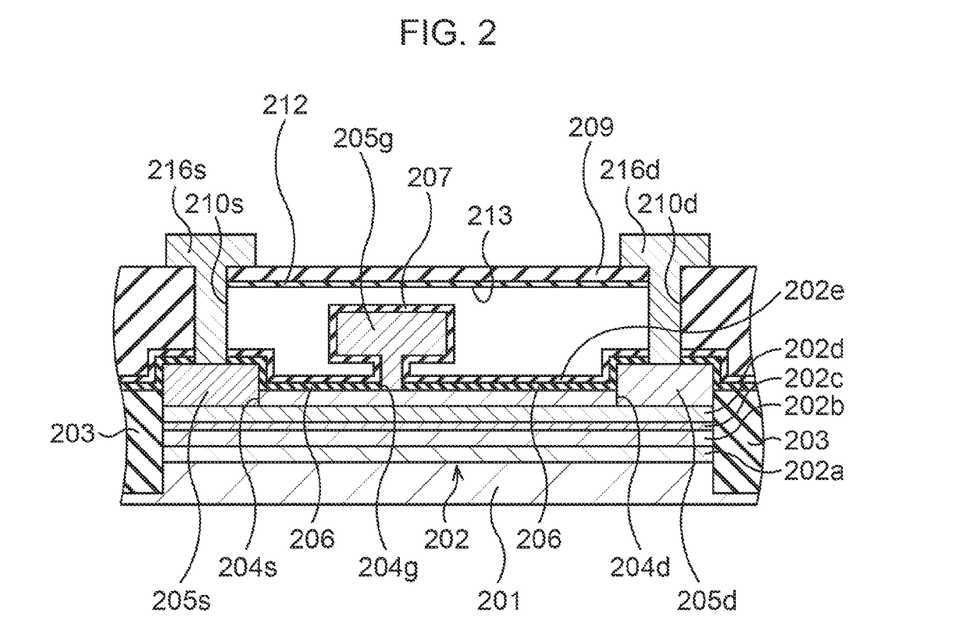
FIG. 2 is a sectional view illustrating a structure of a compound semiconductor device according to a second embodiment.

Next, a second embodiment is described. The second embodiment is an example of a GaN based HEMT. FIG. 2 is a sectional view illustrating a structure of a compound semiconductor device according to the second embodiment.

In the second embodiment, as illustrated in FIG. 2, a buffer layer 202a, an electron transit layer 202b, a spacer layer 202c, an electron supply layer 202d and a cap layer 202e are formed on a substrate 201 such as a semi-insulating SiC substrate, for example. The buffer layer 202a, the electron transit layer 202b, the spacer layer 202c, the electron supply layer 202d and the cap layer 202e are included in a compound semiconductor stacked structure 202. The buffer layer 202a and the electron transit layer 202b are each a GaN layer (i-GaN layer) where intentional impurity doping is not performed, for example. The buffer layer 202a prevents propagation of lattice defects existing at a surface of the substrate 201 to the electron transit layer 202b, for example. The spacer layer 202c is an AlGaN layer (i-AlGaN layer) where intentional impurity doping is not performed, for example. The electron supply layer 202d is an n-type AlGaN layer (n-AlGaN layer), for example. The cap layer 202e is an n-type GaN layer (n-GaN layer), for example. Two-dimensional electron gas (2DEG) exists in a vicinity of an upper surface of the electron transit layer 202b.

An element isolation region 203 defining an active region is formed in the compound semiconductor stacked structure 202. Recesses 204s and 204d through which the electron supply layer 202d is exposed are formed in the cap layer 202e in the active region. A source electrode 205s is formed on the electron supply layer 202d in the recess 204s, and a drain electrode 205d is formed on the electron supply layer 202d in the recess 204d. The source electrode 205s and the drain electrode 205d each include a Ti film and an Al film thereon, for example. A protective film 206 that covers the cap layer 202e, the source electrode 205s and the drain electrode 205d is formed. The protective film 206 contains, for example, silicon nitride, silicon oxide, silicon oxynitride, aluminum nitride, aluminum oxide or aluminum oxynitride, or any combination thereof. A recess 204g through which the cap layer 202e is exposed is formed in the protective film 206 between the source electrode 205s and the drain electrode 205d. A gate electrode 205g is formed on the cap layer 202e in the recess 204g. A cross-sectional shape of the gate electrode 205g is, for example, approximately a T-shape. The gate electrode 205g includes an Ni film and an Au film thereon, for example.

A catalyst film 207 that covers the gate electrode 205g is formed on the protective film 206. The catalyst film 207 has a function activating oxygen, and a material of the catalyst film 207 has a band gap of 3 eV or more and 4 eV or less, for example. The catalyst film 207 contains, for example, titanium oxide or tantalum oxide. A thickness of the catalyst film 207 is 10 nm to 100 nm, for example. A porous electrical insulating film 209 containing an organic constituent is formed on the catalyst film 207. A contact hole 210s through which a part of the source electrode 205s is exposed and a contact hole 210d through which a part of the drain electrode 205d is exposed are formed in the porous electrical insulating film 209, the catalyst film 207 and the protective film 206. A wiring 216s connected to the source electrode 205s via the contact hole 210s and a wiring 216d connected to the drain electrode 205d via the contact hole 210d are formed on the porous electrical insulating film 209. The wiring 216s and the wiring 216d contain Au. A cavity 213 is formed in the porous electrical insulating film 209 between the wiring 216s and the wiring 216d. The cavity 213 is formed around the gate electrode 205g, the gate electrode 205g is in the cavity 213, and the catalyst film 207 is at a lower surface of the cavity. A part of the cavity 213 is between the gate electrode 205g and the source electrode 205s in a planar view, and another part of the cavity 213 is between the gate electrode 205g and the drain electrode 205d in a planar view. Still another part of the cavity 213 is at a level above the gate electrode 205g. A cross-linking layer 212 is formed on a surface of the porous electrical insulating film 209 at the cavity 213 side by a cross-linking reaction of the organic constituent contained in the porous electrical insulating film 209, for example. The cross-linking layer 212 is on an upper surface of the cavity 213, for example.

According to the second embodiment as stated above, a dielectric constant of the porous electrical insulating film 209 is low, and therefore, it is possible to obtain a high current gain cut-off frequency ($f_T$). The cavity 213 is formed around the gate electrode 205g, and therefore, it is possible to obtain fine high-frequency characteristics. A mechanical strength of the porous electrical insulating film 209 is increased by the cross-linking layer 212, and therefore, it is possible to suppress the transmission of moisture via a crack, and to suppress lowering of the electric characteristics due to the transmission of moisture.

Next, a method of manufacturing the compound semiconductor device according to the second embodiment is described. FIG. 3A to FIG. 3L are sectional views illustrating the method of manufacturing the compound semiconductor device according to the second embodiment in process sequence.

Figure 3A:
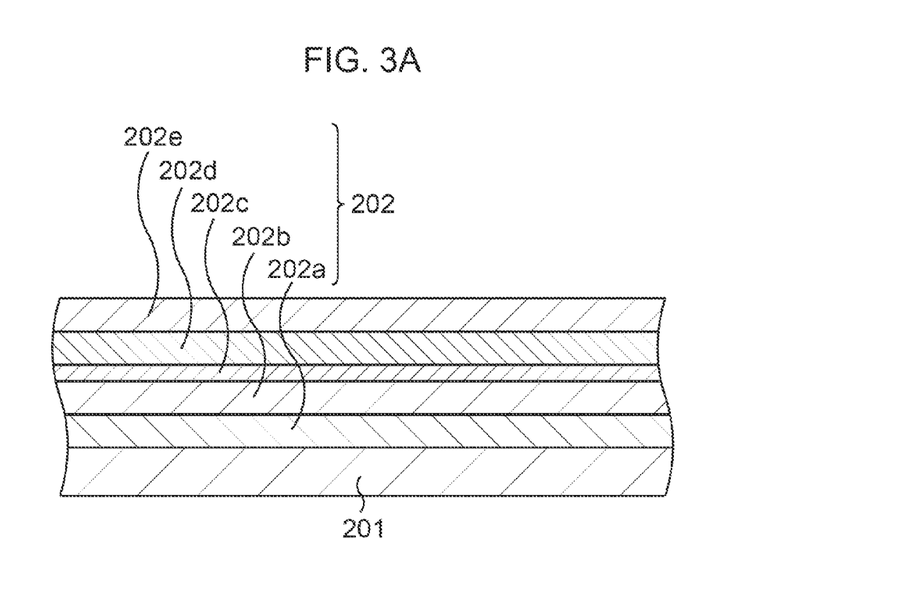

First, as illustrated in FIG. 3A, the buffer layer 202a, the electron transit layer 202b, the spacer layer 202c, the electron supply layer 202d and the cap layer 202e are epitaxially grown on the substrate 201 by a metal organic chemical vapor deposition (MOCVD) method, for example. The buffer layer 202a, the electron transit layer 202b, the spacer layer 202c, the electron supply layer 202d and the cap layer 202e are included in the compound semiconductor stacked structure 202.

Figure 3B:
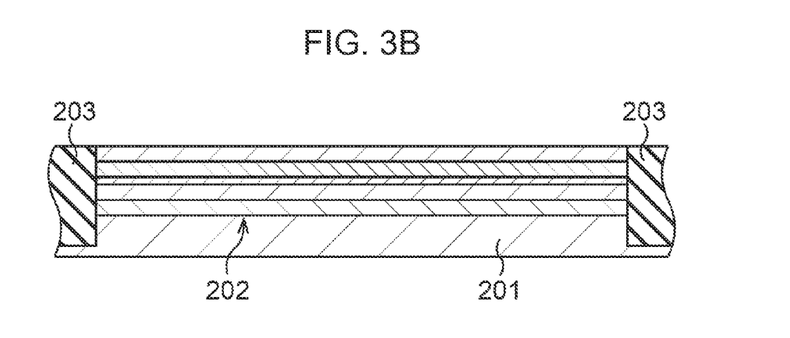

Then, as illustrated in FIG. 3B, the element isolation region 203 is formed in the compound semiconductor stacked structure 202. The element isolation region 203 may be formed by selective injection of Ar, for example.

Figure 3C:
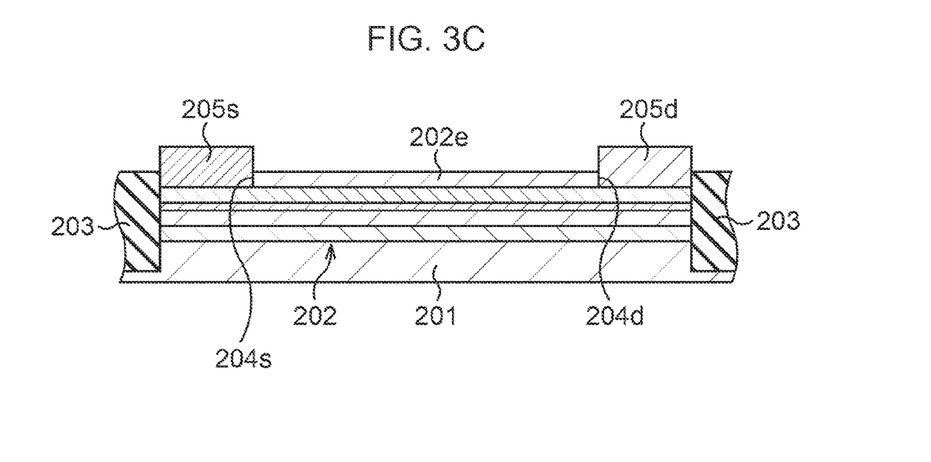

Thereafter, as illustrated in FIG. 3C, the recess 204s for the source electrode and the recess 204d for the drain electrode are formed in the cap layer 202e. Subsequently, the source electrode 205s is formed on the electron supply layer 202d in the recess 204s, and the drain electrode 205d is formed on the electron supply layer 202d in the recess 204d. In the formation of the recess 204s and the recess 204d, for example, a photoresist film is formed on the cap layer 202e and the element isolation region 203, and openings are formed at a region where the recess 204s is to be formed and at a region where the recess 204d is to be formed of the photoresist film by a photolithography technology. Then, the cap layer 202e is dry-etched using the photoresist film as an etching mask. In this dry-etching, for example, chlorine-based gas may be used. The source electrode 205s and the drain electrode 205d may be formed by a lift-off method. For example, a metal film is formed at a whole surface while leaving the photoresist film used for the formation of the recesses 204s, 204d, and the photoresist film is removed together with the metal film formed thereon. After the photoresist film and the metal film thereon are removed, a heat treatment at 400° C. to 1000° C. is performed in a nitrogen atmosphere, for example, and thereby, ohmic characteristics between the remaining metal film and a surface of the compound semiconductor stacked structure 202 (a surface of the electron supply layer 202d) are obtained. As a result, the source electrode 205s and the drain electrode 205d are obtained.

Figure 3D:
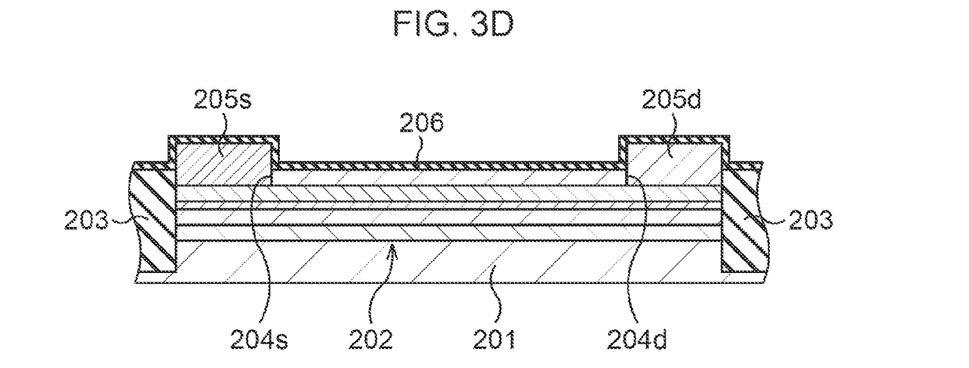

After the source electrode 205s and the drain electrode 205d are obtained, as illustrated in FIG. 3D, the protective film 206 that covers the cap layer 202e, the source electrode 205s and the drain electrode 205d is formed. The protective film 206 may be formed by a plasma CVD method, for example.

Figure 3E:
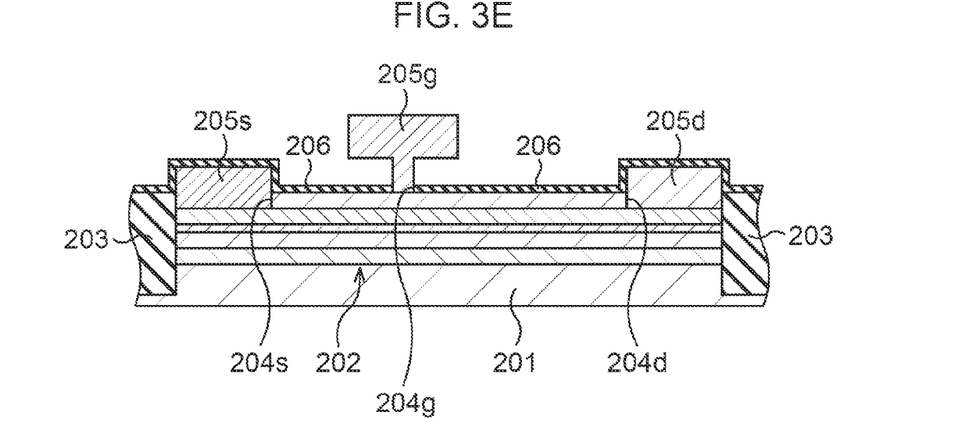

Then, as illustrated in FIG. 3E, the recess 204g for the gate electrode is formed in the protective film 206. Thereafter, the gate electrode 205g is formed on the cap layer 202e in the recess 204g. In the formation of the recess 204g, for example, a photoresist film is formed on the protective film 206, and an opening is formed at a region where the recess 204g is to be formed of the photoresist film by a photolithography technology. Then, the protective film 206 is dry-etched using the photoresist film as an etching mask. In this dry-etching, for example, $SF_6$ gas may be used. The gate electrode 205g may be formed by a lift-off method. For example, the photoresist film used in the formation of the recess 204g is removed, a photoresist film is newly formed, an opening is formed in the photoresist film, a metal film is formed at a whole surface, and the photoresist film is removed together with the metal film formed thereon. As a result, a part of the metal film remains as the gate electrode 205g in the opening of the photoresist film.

Figure 3F:
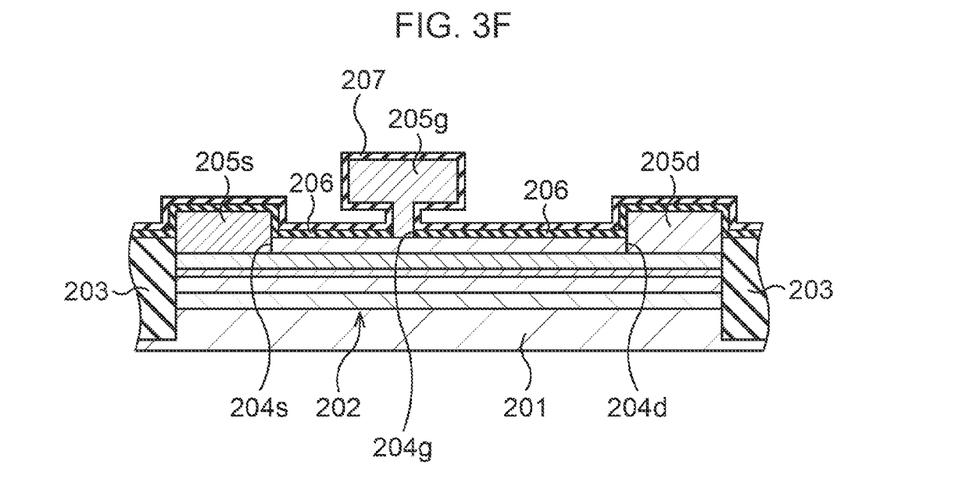

After the gate electrode 205g is formed, as illustrated in FIG. 3F, the catalyst film 207 that covers the gate electrode 205g is formed on the protective film 206.

Figure 3G:
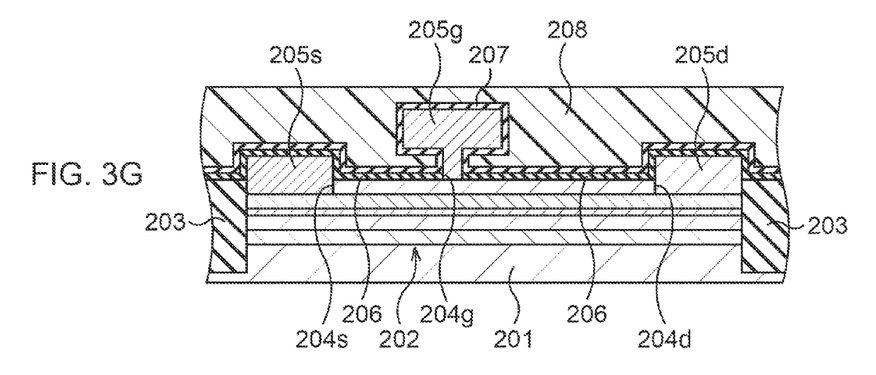

Then, as illustrated in FIG. 3G, an organic film 208 is formed on the catalyst film 207. As the organic film 208, one containing a functional group containing oxygen which can be decomposed by ultraviolet light whose wavelength is 300 nm to 400 nm, for example, a polymethylglutarimide film is formed by a spin-coating method. The organic film 208 is formed to have a thickness, for example, capable of covering the gate electrode 205g from above and the side. As the functional group containing oxygen, a carbonyl group (—CO), a carboxyl group (—COOH) and a hydroxyl group (—OH) may be exemplified, for example, and one of them or any combination thereof may be used. As an organic material with a functional group containing oxygen for the organic film 208, polymethylmethacrylate, polypropylene and polycarbonate may be exemplified, for example.

Figure 3H:
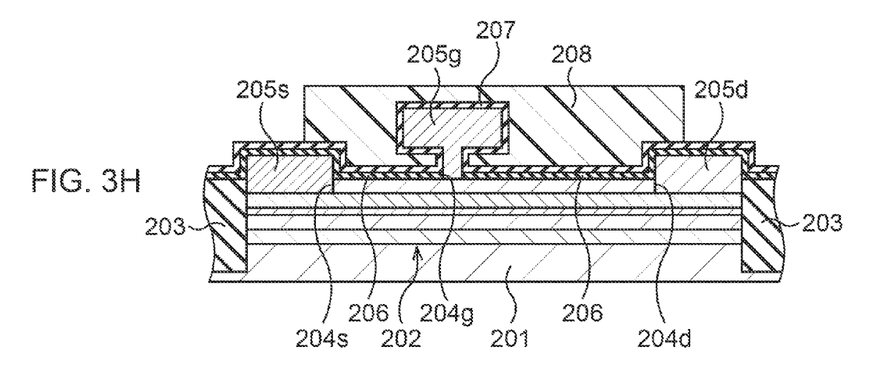

Thereafter, as illustrated in FIG. 3H, a part of the organic film 208 is removed so as to be remained at a region where the cavity is to be formed. The organic film 208 is remained, for example, to overlap with the source electrode 205s and the drain electrode 205d, and to cover the gate electrode 205g from above and the side in a planar view. The removal of a part of the organic film 208 may be performed by forming a photoresist pattern which covers a region where the organic film 208 is to be remained and through which the other region is exposed, and etching the organic film 208 using the photoresist pattern as an etching mask.

Figure 3I:
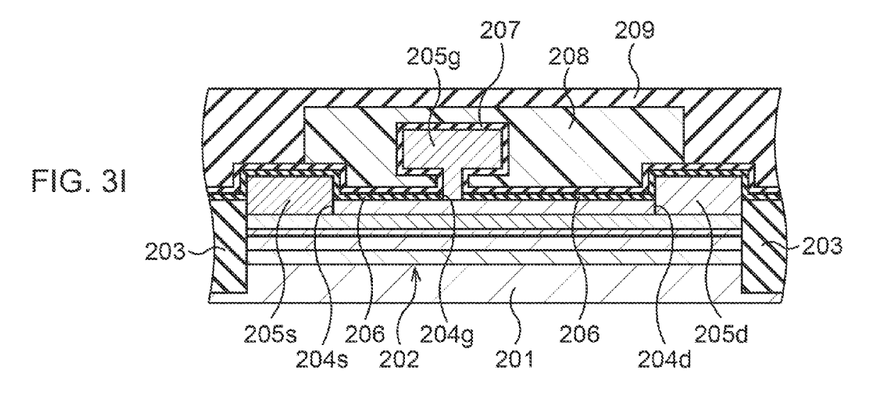

Subsequently, as illustrated in FIG. 3I, the porous electrical insulating film 209 containing the organic constituent, for example, a methyl group (—$CH_3$) or an ethyl group (—$C_2H_5$), or both of them is formed over the organic film 208 and the protective film 206. As the porous electrical insulating film 209, for example, a porous silica film is formed by a spin-coating method.

Figure 3J:
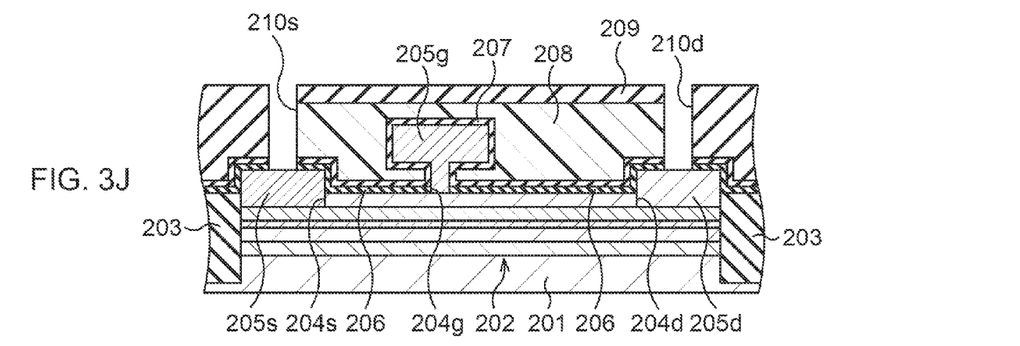

Then, as illustrated in FIG. 3J, the contact hole 210s reaching the source electrode 205s and the contact hole 210d reaching the drain electrode 205d are formed in the porous electrical insulating film 209, the catalyst film 207 and the protective film 206. Though it is not illustrated in FIG. 3J, a contact hole reaching the gate electrode 205g is also formed according to need.

Figure 3K:
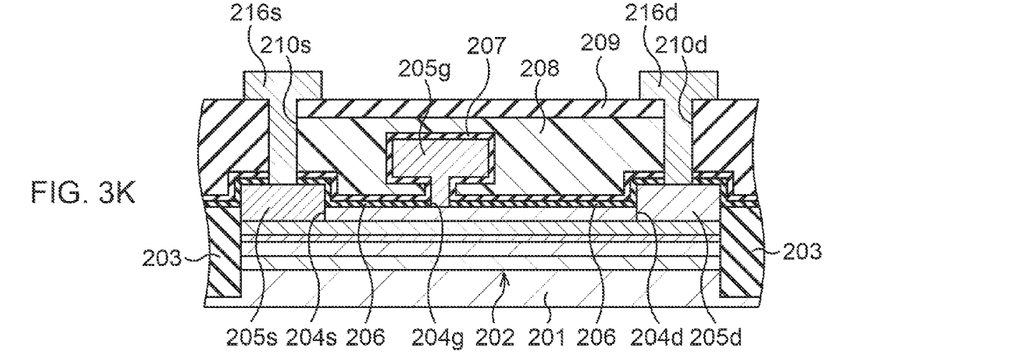

Thereafter, as illustrated in FIG. 3K, the wiring 216s which is in contact with the source electrode 205s via the contact hole 210s and the wiring 216d which is in contact with the drain electrode 205d via the contact hole 210d are formed. In the formation of the wirings 216s, 216d, a seed layer is formed at a whole surface by a sputtering method, a photoresist film is formed on the seed layer, and openings are formed at regions where the wirings are to be formed in the photoresist film. A metal film is formed in each of the openings, the photoresist film is removed, and a part of the seed layer exposed through the metal film is removed. For example, as the seed layer, a stack of a TiW film and an Au film thereon is formed, and as the metal film, an Au film is formed by a plating method. Though it is not illustrated in FIG. 3K, a wiring which is in contact with the gate electrode 205g via the contact hole 210g is also formed according to need.

Figure 3L:
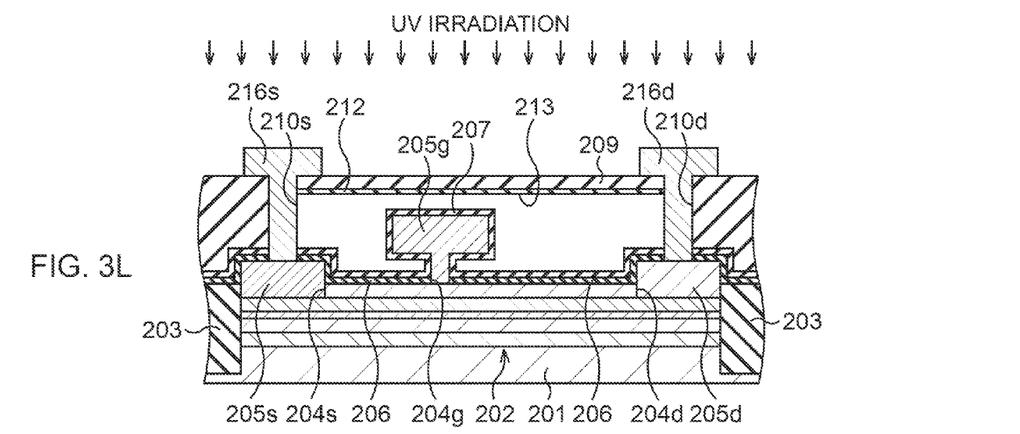

Subsequently, as illustrated in FIG. 3L, the organic film 208 is irradiated with the ultraviolet light having the wavelength which transmits the porous electrical insulating film 209 from above in a vacuum. The wavelength of the ultraviolet light is, for example, approximately 300 nm to 400 nm. The ultraviolet light transmits the porous electrical insulating film 209, and reaches the organic film 208. The organic film 208 is decomposed by the ultraviolet light, and components after the decomposition are removed outside the porous electrical insulating film 209 by passing through the openings of the porous electrical insulating film 209. Further, the functional group containing oxygen is contained in the organic film 208, and therefore, active oxygen such as ozone ($O_3$) is generated on the catalyst film 207 by the UV irradiation. The cross-linking reaction occurs at the surface of the porous electrical insulating film 209 at the cavity 213 side due to the active oxygen, and the cross-linking layer 212 is formed there.

The cross-linking reaction is represented by, for example, the following reaction formula when a methyl group (—$CH_3$) is contained in the porous electrical insulating film 209.

Si—$CH_3$+$O_3$→Si—OH+$CO_2$+$H_2$

Si—OH+HO—Si→Si—O—Si+$H_2O$

The compound semiconductor device according to the second embodiment may be manufactured as stated above. In the embodiment, the stress is applied to the porous electrical insulating film 209 by the decomposition of the organic film 208, but the cross-linking layer 212 is formed due to the decomposition of the organic film 208. The mechanical strength of the cross-linking layer 212 is high, and therefore, a crack is difficult to be made even if the stress is applied. Even if a crack is made in the porous electrical insulating film 209, an end part of the crack is closed due to the formation of the cross-linking layer 212. Accordingly, the transmission of moisture via the crack can be suppressed.

Third Embodiment

Figure 4:
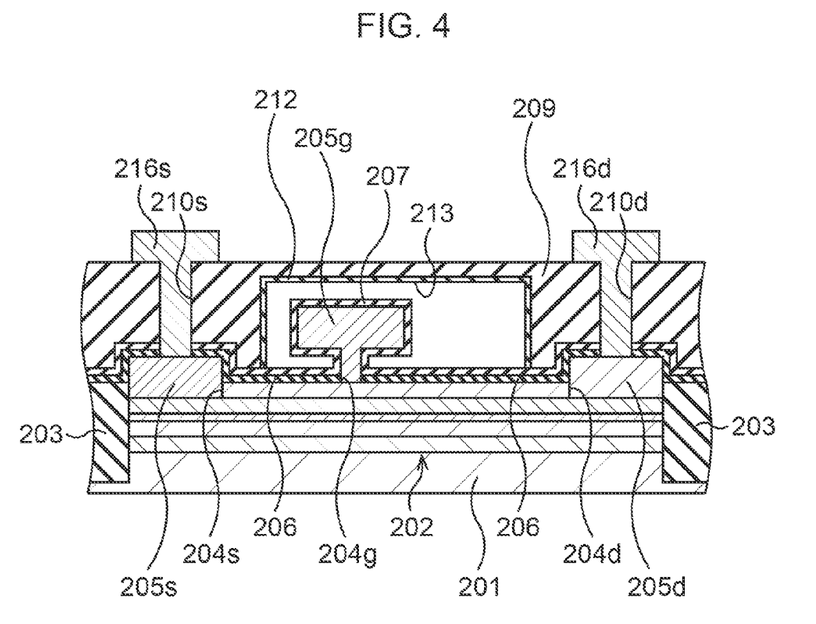
FIG. 4 is a sectional view illustrating a structure of a compound semiconductor device according to a third embodiment.

Next, a third embodiment is described. The third embodiment is an example of a GaN based HEMT. FIG. 4 is a sectional view illustrating a structure of a compound semiconductor device according to the third embodiment.

In the third embodiment, as illustrated in FIG. 4, a side surface of the cavity 213 at the source electrode 205s side is between the gate electrode 205g and the wiring 216s, and a side surface of the cavity 213 at the drain electrode 205d side is between the gate electrode 205g and the wiring 216d in a planar view. The cross-linking layer 212 is formed also at a side surface of the porous electrical insulating film 209 at the cavity 213 side. The cross-linking layer 212 is at an upper surface and a side surface of the cavity 213, for example. The other constitutions are the same as the second embodiment.

According to the third embodiment as stated above, it is also possible to suppress the transmission of moisture heading for the gate electrode 205g via an interface between the wiring 216s or 216d and the porous electrical insulating film 209, for example.

When the compound semiconductor device according to the third embodiment is manufactured, a part to be remained is made small when a part of the organic film 208 is removed, for example.

Fourth Embodiment

Figure 5:
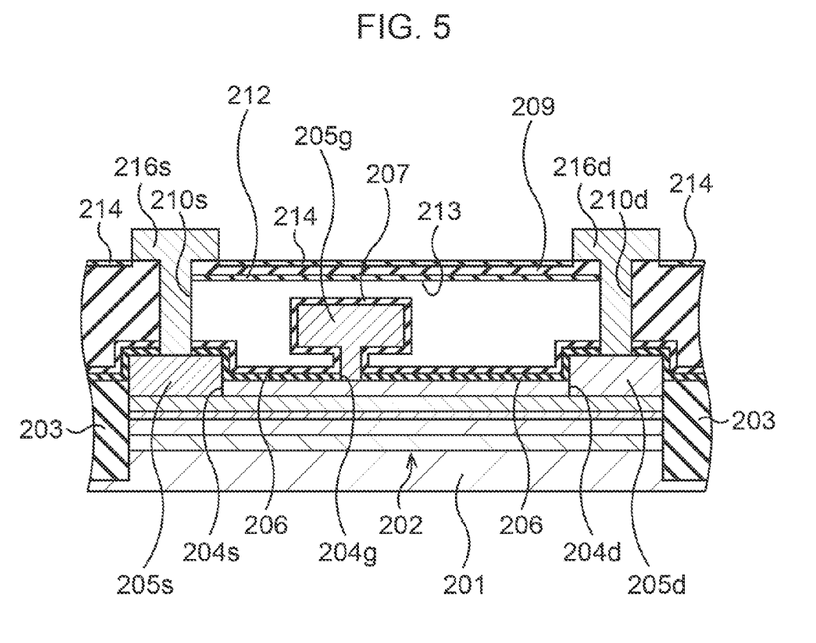
FIG. 5 is a sectional view illustrating a structure of a compound semiconductor device according to a fourth embodiment.

Next, a fourth embodiment is described. The fourth embodiment is an example of a GaN based HEMT. FIG. 5 is a sectional view illustrating a structure of a compound semiconductor device according to the fourth embodiment.

In the fourth embodiment, as illustrated in FIG. 5, a cross-linking layer 214 is formed on an upper surface of the porous electrical insulating film 209. The cross-linking layer 214 is formed by the cross-linking reaction of the organic constituent contained in the porous electrical insulating film 209 as same as the cross-linking layer 212. The other constitutions are the same as the second embodiment.

According to the fourth embodiment, the mechanical strength of the porous electrical insulating film 209 is increased also by the cross-linking layer 214, and therefore, the transmission of moisture via the crack can further be suppressed, and the lowering of the electric characteristics due to the transmission of moisture can further be suppressed.

When the compound semiconductor device according to the fourth embodiment is manufactured, for example, the UV irradiation is performed in an atmosphere containing oxygen. The oxygen in the atmosphere is activated by the ultraviolet light and so on, and therefore, the cross-linking reaction occurs also at the upper surface of the porous electrical insulating film 209. The UV irradiation as stated above may be performed in the air, or may be performed while supplying nitrogen gas and oxygen gas in a vacuumed chamber, for example.

Fifth Embodiment

Figure 6:
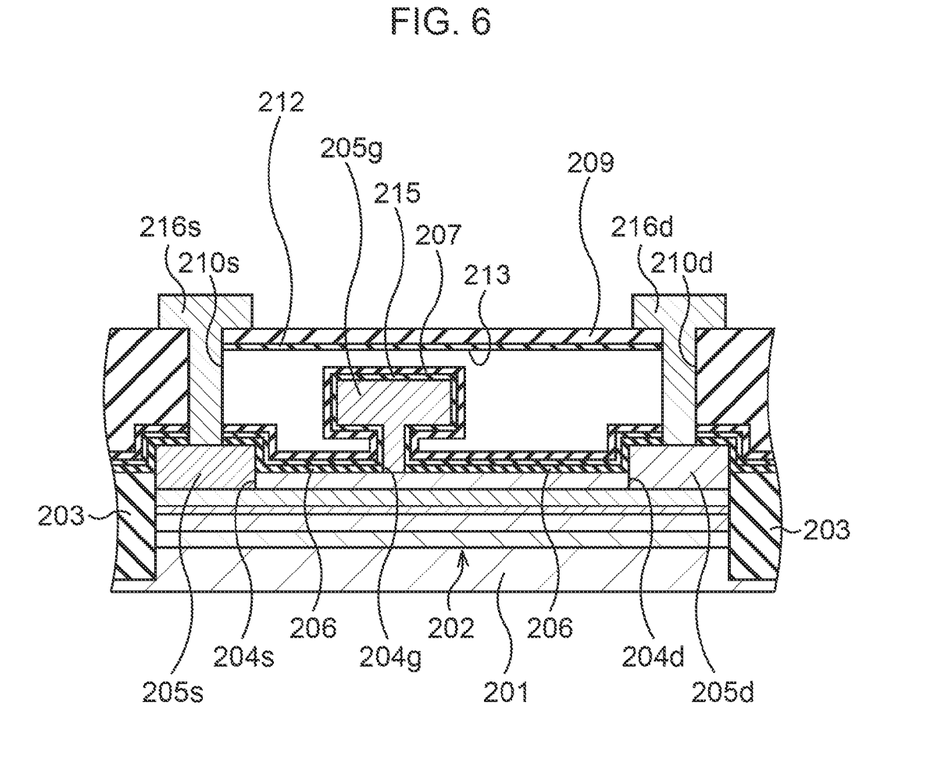
FIG. 6 is a sectional view illustrating a structure of a compound semiconductor device according to a fifth embodiment.

Next, a fifth embodiment is described. The fifth embodiment is an example of a GaN based HEMT. FIG. 6 is a sectional view illustrating a structure of a compound semiconductor device according to the fifth embodiment.

In the fifth embodiment, as illustrated in FIG. 6, a protective film 215 is formed under the catalyst film 207. The protective film 215 contains, for example, silicon nitride, silicon oxide, silicon oxynitride, aluminum nitride, aluminum oxide or aluminum oxynitride, or any combination thereof. The other constitutions are the same as the second embodiment.

When the compound semiconductor device according to the fifth embodiment is manufactured, for example, the protective film 215 may be formed after the gate electrode 205g is formed and before the catalyst film 207 is formed.

The fourth embodiment and/or the fifth embodiment may be combined with the third embodiment, and the fifth embodiment may be combined with the fourth embodiment. As the compound semiconductor, a nitride semiconductor such as InAlN, InAlGaN may be used, and InP or the like may be also used.

The structures of the gate electrode, the source electrode and the drain electrode are not limited to the above-stated embodiments. For example, these may be made up of a single layer. The formation method thereof is not limited to the lift-off method. Further, the heat treatment after the formation of the source electrode and the drain electrode may not be performed as long as the ohmic characteristics can be obtained. The heat treatment may be performed for the gate electrode.

As the substrate, an SiC substrate, a sapphire substrate, a GaN substrate, an AlN substrate, an Si substrate, a GaAs substrate, or the like may be used. The substrate may be any of conductive, semi-insulating, or insulating. The thickness, the material, and so on of each layer are not also limited to the above-stated embodiments.

Next, experiments performed by the present inventors are described. In these experiments, the example following the second embodiment was manufactured, and elastic modulus of the porous electrical insulating film including the cross-linking layer was measured. The example was left to stand in the air for six months, resistances of the gate electrode $205g$ were measured before and after the leaving to stand, and a resistance change ratio (increase ratio) before and after the leaving to stand was measured. Further, as a comparison, the elastic modulus and the resistance change ratio were also measured as for a reference example in which the formation of the catalyst film and the formation of the cross-linking layer were omitted. Results of these are illustrated in FIG. 7A and FIG. 7B.

Figure 7A:
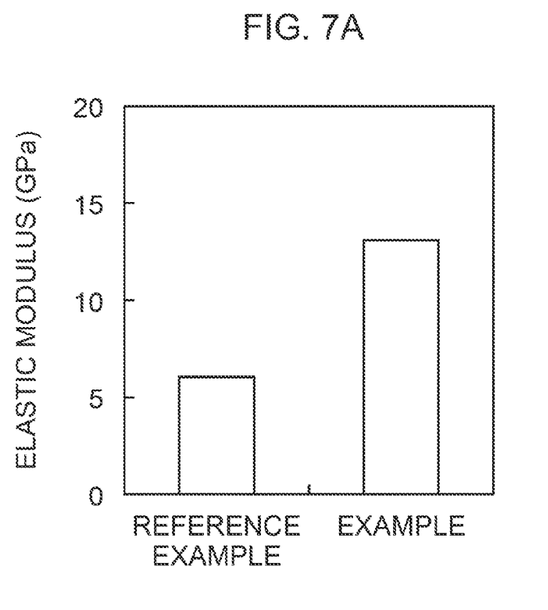
FIG. 7A is a graph illustrating a result of measuring elastic modulus.
Figure 7B:
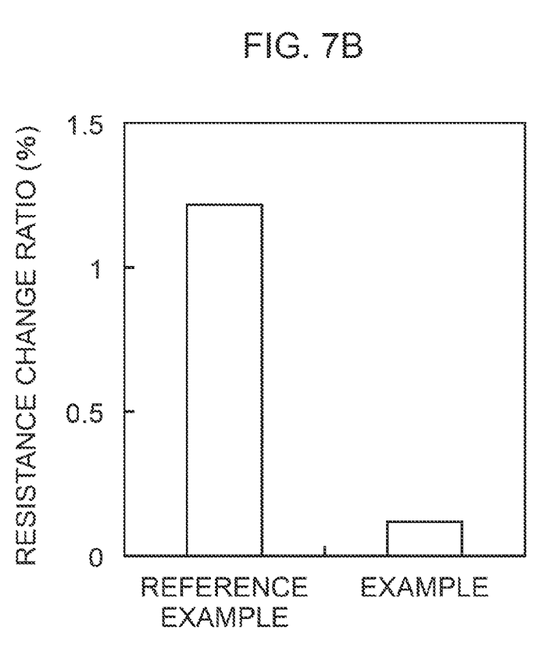
FIG. 7B is a graph illustrating a result of measuring resistance change ratio.

As illustrated in FIG. 7A, the elastic modulus of the reference example is 6 GPa, and the elastic modulus of the example is 13 GPa being twice or more. As illustrated in FIG. 7B, the resistance change ratio of the reference example is 1.2%, and the resistance change ratio of the example is only 0.1%. From these results, it is obvious that the cross-linking layer contributes to the improvement in the strength and the improvement in the water resistance of the porous electrical insulating film.

Sixth Embodiment

Figure 8:
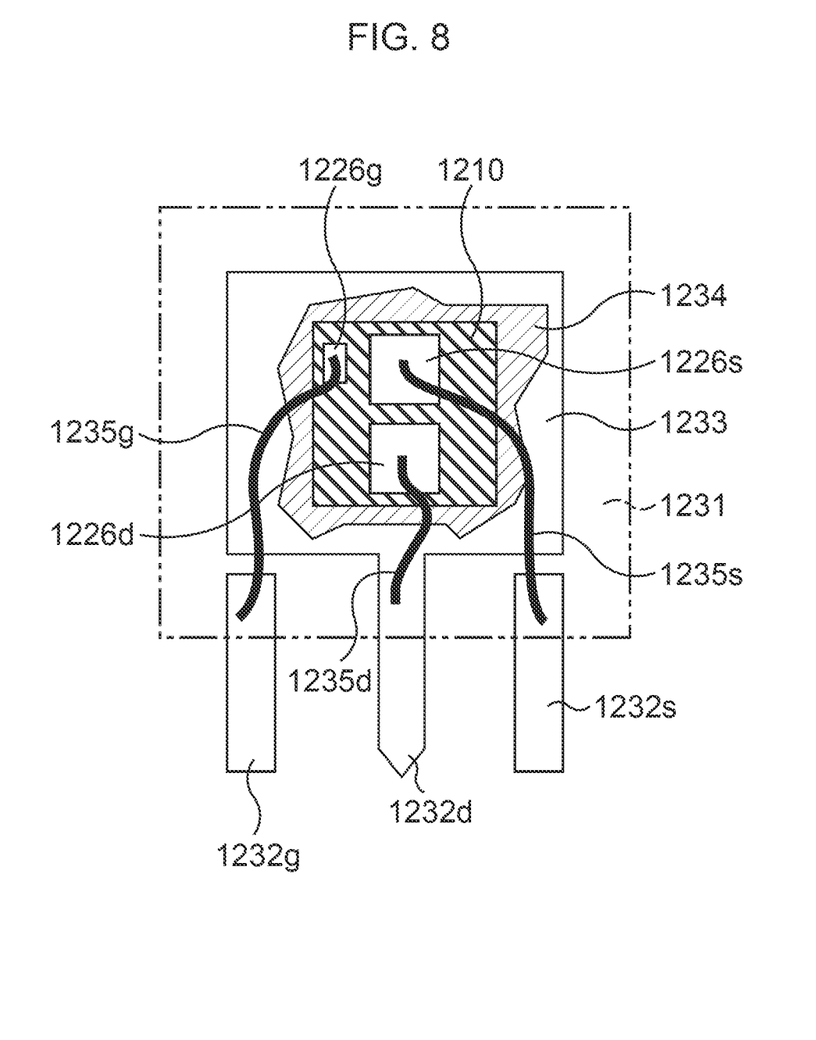
FIG. 8 is a view illustrating a discrete package according to a sixth embodiment.

Next, a sixth embodiment is described. The sixth embodiment relates to a discrete package of a compound semiconductor device which includes a GaN-based HEMT. FIG. 8 is a view illustrating the discrete package according to the sixth embodiment.

In the sixth embodiment, as illustrated in FIG. 8, a back surface of a HEMT chip 1210 of the compound semiconductor device according to any one of the second to fifth embodiments is fixed on a land (die pad) 1233, using a die attaching agent 1234 such as solder. One end of a wire $1235d$ such as an Al wire is bonded to a drain pad $1226d$, to which the drain electrode $205d$ is connected, and the other end of the wire $1235d$ is bonded to a drain lead $1232d$ integral with the land 1233. One end of a wire $1235s$ such as an Al wire is bonded to a source pad $1226s$, to which the source electrode $205s$ is connected, and the other end of the wire $1235s$ is bonded to a source lead $1232s$ separated from the land 1233. One end of a wire $1235g$ such as an Al wire is bonded to a gate pad $1226g$, to which the gate electrode $205g$ is connected, and the other end of the wire $1235g$ is bonded to a gate lead $1232g$ separated from the land 1233. The land 1233, the HEMT chip 1210 and so forth are packaged with a molding resin 1231, so as to project outwards a portion of the gate lead $1232g$, a portion of the drain lead $1232d$, and a portion of the source lead $1232s$.

The discrete package may be manufactured by the procedures below, for example. First, the HEMT chip 1210 is bonded to the land 1233 of a lead frame, using a die attaching agent 1234 such as solder. Next, with the wires $1235g$, $1235d$ and $1235s$, the gate pad $1226g$ is connected to the gate lead $1232g$ of the lead frame, the drain pad $1226d$ is connected to the drain lead $1232d$ of the lead frame, and the source pad $1226s$ is connected to the source lead $1232s$ of the lead frame, respectively, by wire bonding. The molding with the molding resin 1231 is conducted by a transfer molding process. The lead frame is then cut away.

Seventh Embodiment

Figure 9:
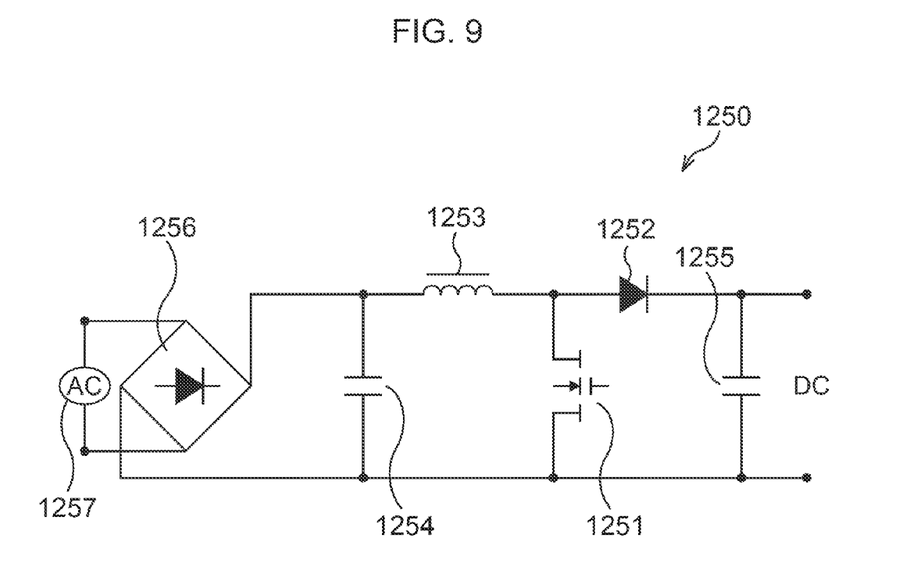
FIG. 9 is a wiring diagram illustrating a PFC circuit according to a seventh embodiment.

Next, a seventh embodiment is described. The seventh embodiment relates to a PFC (power factor correction) circuit equipped with a compound semiconductor device which includes a GaN-based HEMT. FIG. 9 is a wiring diagram illustrating the PFC circuit according to the seventh embodiment.

A PFC circuit 1250 has a switching element (transistor) 1251, a diode 1252, a choke coil 1253, capacitors 1254 and 1255, a diode bridge 1256, and an AC power source (AC) 1257. The drain electrode of the switching element 1251, the anode terminal of the diode 1252, and one terminal of the choke coil 1253 are connected with each other. The source electrode of the switching element 1251, one terminal of the capacitor 1254, and one terminal of the capacitor 1255 are connected with each other. The other terminal of the capacitor 1254 and the other terminal of the choke coil 1253 are connected with each other. The other terminal of the capacitor 1255 and the cathode terminal of the diode 1252 are connected with each other. A gate driver is connected to the gate electrode of the switching element 1251. The AC 1257 is connected between both terminals of the capacitor 1254 via the diode bridge 1256. A DC power source (DC) is connected between both terminals of the capacitor 1255. In the embodiment, the compound semiconductor device according to any one of the second to fifth embodiments is used as the switching element 1251.

In the method of manufacturing the PFC circuit 1250, for example, the switching element 1251 is connected to the diode 1252, the choke coil 1253 and so forth with solder, for example.

Eighth Embodiment

Figure 10:
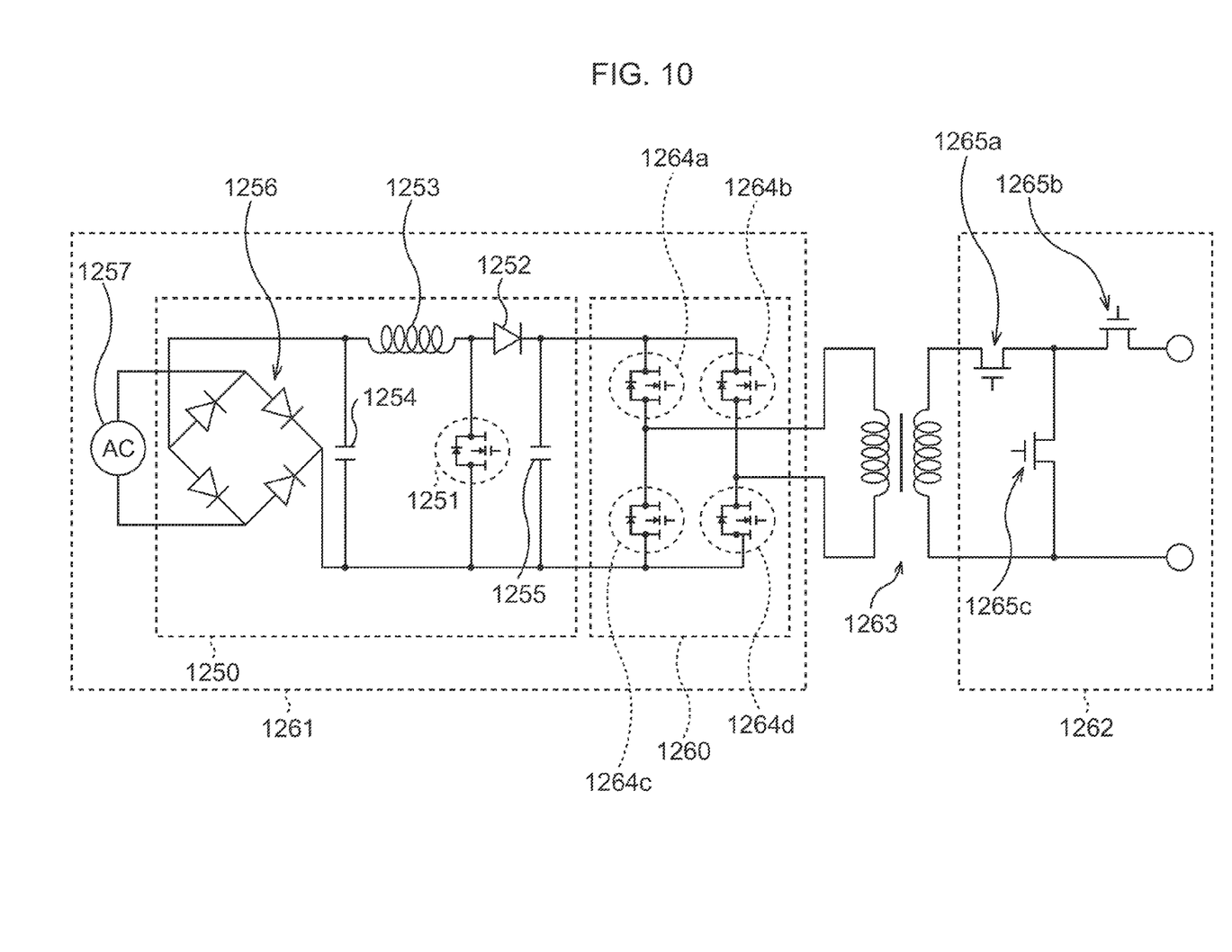
FIG. 10 is a wiring diagram illustrating a power supply apparatus according to an eighth embodiment.

Next, an eighth embodiment is described. The eighth embodiment relates to a power supply apparatus equipped with a compound semiconductor device which includes a GaN-based HEMT. FIG. 10 is a wiring diagram illustrating the power supply apparatus according to the eighth embodiment.

The power supply apparatus includes a high-voltage, primary-side circuit 1261, a low-voltage, secondary-side circuit 1262, and a transformer 1263 arranged between the primary-side circuit 1261 and the secondary-side circuit 1262.

The primary-side circuit 1261 includes the PFC circuit 1250 according to the seventh embodiment, and an inverter circuit, which may be a full-bridge inverter circuit 1260, for example, connected between both terminals of the capacitor 1255 in the PFC circuit 1250. The full-bridge inverter circuit 1260 includes a plurality of (four, in the embodiment) switching elements $1264a$, $1264b$, $1264c$ and $1264d$.

The secondary-side circuit 1262 includes a plurality of (three, in the embodiment) switching elements $1265a$, $1265b$ and $1265c$.

In the embodiment, the compound semiconductor device according to any one of second to fifth embodiments is used for the switching element 1251 of the PFC circuit 1250, and for the switching elements $1264a$, $1264b$, $1264c$ and $1264d$ of the full-bridge inverter circuit 1260. The PFC circuit 1250 and the full-bridge inverter circuit 1260 are components of the primary-side circuit 1261. On the other hand, a silicon-based general MIS-FET (field effect transistor) is used for the switching elements 1265a, 1265b and 1265c of the secondary-side circuit 1262.

Ninth Embodiment

Figure 11:
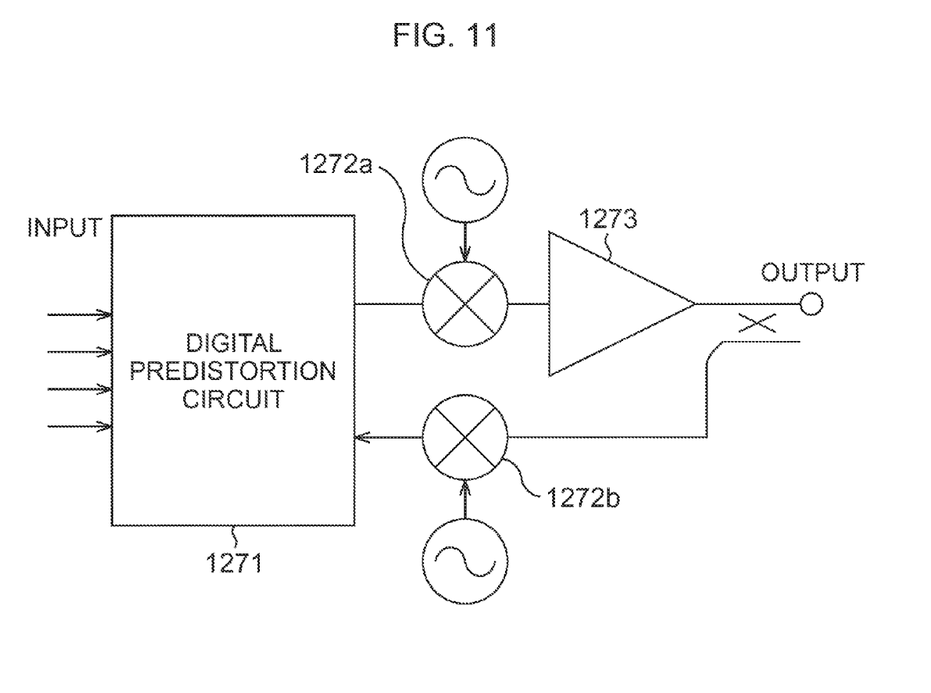
FIG. 11 is a wiring diagram illustrating an amplifier according to a ninth embodiment.

Next, a ninth embodiment is explained. The ninth embodiment relates to an amplifier equipped with the compound semiconductor device which includes a GaN-based HEMT. FIG. 11 is a wiring diagram illustrating the amplifier according to the ninth embodiment.

The amplifier includes a digital predistortion circuit 1271, mixers 1272a and 1272b, and a power amplifier 1273.

The digital predistortion circuit 1271 compensates non-linear distortion in input signals. The mixer 1272a mixes the input signal having the non-linear distortion already compensated, with an AC signal. The power amplifier 1273 includes the compound semiconductor device according to any one of the second to fifth embodiments, and amplifies the input signal mixed with the AC signal. In the embodiment, the signal on the output side may be mixed, upon switching, with an AC signal by the mixer 1272b, and may be sent back to the digital predistortion circuit 1271. The amplifier may be used as a high-frequency amplifier or a high-output amplifier.

According to the above-described compound semiconductor device and the like, lowering of strength of an insulating film due to formation of a cavity can be suppressed, since an adequate cross-linking layer is included.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. A compound semiconductor device, comprising:
   an electron transit layer;
   an electron supply layer over the electron transit layer;
   a gate electrode, a source electrode and a drain electrode at a level above the electron supply layer; and
   a porous electrical insulating film that covers the gate electrode, the source electrode and the drain electrode, the porous electrical insulating film containing an organic constituent, and a cavity being formed around the gate electrode in the porous electrical insulating film,
   wherein a cross-linking layer is on a surface of the porous electrical insulating film at the cavity side.

2. The compound semiconductor device according to claim 1, further comprising a catalyst film that comprises a function activating oxygen at a lower surface of the cavity.

3. The compound semiconductor device according to claim 2, wherein the catalyst film contains titanium oxide.

4. The compound semiconductor device according to claim 2, wherein a material of the catalyst film comprises a band gap of 3 eV or more and 4 eV or less.

5. The compound semiconductor device according to claim 1, further comprising a second cross-linking layer on an upper surface of the porous electrical insulating film.

6. A power supply apparatus, comprising
   a compound semiconductor device, wherein the compound semiconductor device comprises:
   an electron transit layer;
   an electron supply layer over the electron transit layer;
   a gate electrode, a source electrode and a drain electrode at a level above the electron supply layer; and
   a porous electrical insulating film that covers the gate electrode, the source electrode and the drain electrode, the porous electrical insulating film containing an organic constituent, and a cavity being formed around the gate electrode in the porous electrical insulating film,
   wherein a cross-linking layer is on a surface of the porous electrical insulating film at the cavity side.

7. An amplifier, comprising
   a compound semiconductor device, wherein the compound semiconductor device comprises:
   an electron transit layer;
   an electron supply layer over the electron transit layer;
   a gate electrode, a source electrode and a drain electrode at a level above the electron supply layer; and
   a porous electrical insulating film that covers the gate electrode, the source electrode and the drain electrode, the porous electrical insulating film containing an organic constituent, and a cavity being formed around the gate electrode in the porous electrical insulating film,
   wherein a cross-linking layer is on a surface of the porous electrical insulating film at the cavity side.

8. A method of manufacturing a compound semiconductor device, comprising:
   forming an electron supply layer over an electron transit layer;
   forming a gate electrode, a source electrode and a drain electrode at a level above the electron supply layer;
   forming an organic film around the gate electrode, the organic film containing a functional group containing oxygen;
   forming a porous electrical insulating film that covers the gate electrode, the source electrode and the drain electrode over the organic film, the porous electrical insulating film containing an organic constituent; and
   irradiating the organic film with ultraviolet light through the porous electrical insulating film so as to decompose the organic film, form a cavity in the porous electrical insulating film while forming a cross-linking layer on a surface of the porous electrical insulating film at the cavity side.

9. The method according to claim 8, further comprising forming a catalyst film that comprises a function activating oxygen before forming the organic film.

10. The method according to claim 9, wherein the catalyst film contains titanium oxide.

11. The method according to claim 9, wherein a material of the catalyst film comprises a band gap of 3 eV or more and 4 eV or less.

12. The method according to claim 8, wherein the organic film is irradiated with the ultraviolet light in an atmosphere containing oxygen so as to form a second cross-linking layer on an upper surface of the porous electrical insulating film.

13. The method according to claim 8, wherein a wavelength of the ultraviolet light is 300 nm to 400 nm.

14. The method according to claim 8, wherein the functional group contains a carbonyl group, a carboxyl group or a hydroxyl group, or any combination thereof.

* * * * *